United States Patent [19]
Kimura

[11] Patent Number: 5,982,200
[45] Date of Patent: Nov. 9, 1999

[54] COSTAS LOOP CARRIER RECOVERY CIRCUIT USING SQUARE-LAW CIRCUITS

[75] Inventor: Katsuji Kimura, Tokyo, Japan

[73] Assignee: NEC Corporation, Tokyo, Japan

[21] Appl. No.: 08/914,159

[22] Filed: Aug. 19, 1997

[30] Foreign Application Priority Data

Aug. 30, 1996 [JP] Japan ................................. 8-248917

[51] Int. Cl.6 .............................. H03L 7/087; H03L 7/093
[52] U.S. Cl. .............................. 327/47; 327/41; 327/113; 327/355; 375/327; 375/344; 329/307; 331/12
[58] Field of Search .................................. 327/39, 41, 46, 327/47, 113, 355, 100; 375/327, 329, 344, 376; 329/307; 331/12, 17

[56] References Cited

U.S. PATENT DOCUMENTS

| | | | |
|---|---|---|---|
| 4,109,102 | 8/1978 | Yoshida et al. | 375/332 |
| 4,475,218 | 10/1984 | Takeda et al. | 375/327 |
| 5,107,150 | 4/1992 | Kimura | 327/356 |
| 5,187,682 | 2/1993 | Kimura | 364/841 |
| 5,438,296 | 8/1995 | Kimura | 327/560 |
| 5,444,648 | 8/1995 | Kimura | 364/841 |
| 5,481,224 | 1/1996 | Kimura | 330/253 |
| 5,485,119 | 1/1996 | Kimura | 330/253 |
| 5,523,717 | 6/1996 | Kimura | 330/252 |
| 5,576,653 | 11/1996 | Kimura | 327/356 |
| 5,581,210 | 12/1996 | Kimura | 327/355 |
| 5,581,211 | 12/1996 | Kimura | 327/356 |
| 5,602,509 | 2/1997 | Kimura | 330/253 |
| 5,617,052 | 4/1997 | Kimura | 327/356 |
| 5,640,121 | 6/1997 | Kimura | 327/359 |
| 5,688,750 | 11/1997 | Kimura | 364/841 |

FOREIGN PATENT DOCUMENTS

| | | |
|---|---|---|
| 61-43049 | 3/1986 | Japan . |
| 4-79546 | 3/1992 | Japan . |
| 5-83311 | 4/1993 | Japan . |
| 7147771 | 6/1995 | Japan . |
| 7177736 | 7/1995 | Japan . |
| 2017436 | 10/1979 | United Kingdom . |
| 2280324 | 1/1995 | United Kingdom . |

Primary Examiner—Dinh Le
Attorney, Agent, or Firm—Sughrue, Mion, Zinn, Macpeak & Seas, PLLC

[57] ABSTRACT

By using the two square-law circuits for squaring the common mode and orthogonal components of the carrier wave and by using the multiplying circuit for multiplying these squared signals, the Costas loop carrier recovery circuit can be constituted. The carrier recovery circuit is constituted such that a phase synchronous circuit constituted by a PLL is controlled by a signal obtained by removing a sign component from an input carrier wave.

2 Claims, 3 Drawing Sheets

COSTAS LOOP CARRIER RECOVERY CIRCUIT USING SQUARE-LAW CIRCUITS

BACKGROUND OF THE INVENTION

1. Field of the Invention

The present invention relates to a demodulation device for a four phase modulated wave, more particularly to a Costas loop carrier recovery circuit which is suitably formed on a semiconductor integrated circuit and is excellent in a linearity.

2. Description of the Related Art

Since a digital phase modulation method for a carrier wave called a PSK (Phase Shift Keying) method is generally superior in its predetermined band characteristic and error ratio characteristic to other methods such as amplitude modulation, frequency modulation and bias modulation, the digital phase modulation method has been widely used for microwave digital communication using a microwave pulse code modulation, satellite broadcast communication and data transmission modems. The PSK method in which a phase is shifted by $\pi/4$ has been used also in digital mobile communication, and it is becoming more popular.

In this quadriphase PSK method, digital codes of signals to be transmitted are partitioned every two bits and the carrier waves are modulated depending on a quantity of phase variations which correspond to these four combinations. In the majority of the quadriphase PSK methods put into practical uses, the quantities of phase variations $0$, $\pi/2$, $\pi$, and $3\pi/2$ correspond to the four combinations $(0, 0)$, $(0, 1)$, $(1, 0)$ and $(1, 1)$, respectively.

Therefore, since two bit signal components are included in a common mode component I and an orthogonal component Q of the carrier wave, respectively, it is sufficient that the common mode component and the quadrature component of the carrier wave are detected in order to judge plus and minus of them when they are demodulated.

A synchronous detection method as the detection method in case where the common mode and orthogonal components are detected produces low noise and is excellent in an error ratio characteristic so that it is frequently used. Unlike other delay detection methods, it is necessary that a carrier wave recovery circuit be provided on a receiving side to generate a carrier wave having a correct phase.

This carrier wave recovery circuit is constituted as a circuit which is designed such that a phase synchronous circuit constituted by a PLL (Phase Locked Loop) is controlled by a signal obtained by removing a sign component from an input carrier wave.

FIG. 1 is a block diagram showing a constitution of a conventional Costas loop carrier recovery circuit.

Referring to FIG. 1, reference numerals 1, 2 and 17 denote multipliers; 3, 4 and 8, low pass filters (LPFs); 15, an adder; 16, a subtracter; 9, a voltage controlled x'tal oscillator (VCXO); and 10, a phase shifter, respectively.

A signal of the quadriphase modulated wave is expressed as the following equation (1), when $\omega t$ is a frequency of the carrier wave and phases of $\Theta$ is shifted by $0$, $\pi/2$, $\pi$ and $3\pi/2$, respectively.

$$S = E\cos(\omega t + \Theta) \qquad (1)$$

Furthermore, when two outputs from the VCXO 9 are assumed to be signals A and B, one of the signals A and B being an output obtained by shifting the phase of the other by $\pi/2$ by the phase shifter 10, the signals A and B are expressed by the following equations (2) and (3).

$$A = E_1 \sin(\omega t + \Theta_1) \qquad (2)$$

$$B = E_1 \cos(\omega t + \Theta_1) \qquad (3)$$

When a quadriphase modulation wave S and the oscillator outputs A and B are demodulated by the multiplication circuits 1 and 2 and then pass through the LPFs 3 and 4, an output from the multiplier 1 is expressed by the following equation (4).

$$E\cos(\omega t+\theta)\times E_1 \sin(\omega t+\theta_1)$$

$$E\cos(\omega t+\theta)\times E_1\sin(\omega t+\theta_1) = \frac{E\cdot E_1}{2}\{\sin(2\omega t+\theta-\theta_1) - \sin(\theta-\theta_1)\} \qquad (4)$$

When the output from the multiplier 1 is allowed to pass through the LPF 3, an alternation current component is removed. The following equation (5) is obtained.

$$\frac{E\cdot E_1}{2}\sin(\theta-\theta_1) \qquad (5)$$

Similarly, the output from the multiplier 2 is obtained by multiplying the equation (1) with the equation (3) as shown by the following equation (6).

$$E\cos(\omega t+\theta)\times E_1\cos(\omega t+\theta_1) = \frac{E\cdot E_1}{2}\{\cos(2\omega t+\theta+\theta_1) + \cos(\theta-\theta_1)\} \qquad (6)$$

When the output from the multiplier 2 is allowed to pass through the LPF 4, the following equation (7) is obtained.

$$\frac{E\cdot E_1}{2}\cos(\theta-\theta_1) \qquad (7)$$

A computation circuit disposed after the outputs of the LPFs 3 and 4 is a Costas loop carrier recovery circuit, which keeps the phase of an output signal from the VCXO 9 constant whichever phase state $(0, \pi/2, \pi$ and $3\pi/2)$ the quadriphase modulated wave of the input carrier wave may take.

Supposing that the demodulated signal of the equation (5) is P and the signal of the equation (7) is Q, the output point E of the adder circuit 15 outputs P+Q; the output point F of the subtracting circuit 16, P−Q; and the output G of the multiplying circuit 17, P×Q×(P+Q)×(P−Q). Furthermore, the following equations (8) and (9) are given.

$$P\times Q = \frac{E\cdot E_1}{2}\sin(\theta-\theta_1)\times\frac{E\cdot E_1}{2}\cos(\theta-\theta_1) \qquad (8)$$

$$= \frac{(E\cdot E_1)^2}{8}\sin(2\theta-2\theta_1)$$

$$(P+Q)\times(P-Q) = P^2 - Q^2 \qquad (9)$$

$$= \left\{\frac{E\cdot E_1}{2}\sin(\theta-\theta_1)\right\}^2 - \left\{\frac{E\cdot E_1}{2}\cos(\theta-\theta_1)\right\}^2$$

$$= -\frac{(E\cdot E_1)^2}{4}\cos(2\theta-2\theta_1)$$

Therefore, at the output point G of the four level multiplier, the following equation can be obtained from the equation (8)×the equation (9).

$$(P+Q) \times (P-Q) \times P \times Q = \left\{ \frac{(E \cdot E_1)^2}{8} \sin(2\theta - 2\theta_1) \right\} \times \quad (10)$$

$$\left\{ -\frac{(E \cdot E_1)^2}{4} \cos(2\theta - 2\theta_1) \right\}$$

$$= -\frac{(E \cdot E_1)^4}{64} \{\sin(4\theta - 4\theta_1) + \sin 0\}$$

$$= -\frac{(E \cdot E_1)^4}{64} \sin\{4(\theta - \theta_1)\}$$

This implies that the phase difference between the quadriphase modulation wave and the output signal from the VCXO 9 is $n\pi/4$ (n: integer), the output voltage becomes relatively zero, and the PLL is locked at this state.

Consequently, when this output G is allowed to return to the VCXO 9 through the LPF 8, data of the signals P and Q will be demodulated.

However, in the constitution of the conventional quadriphase demodulation circuit shown in FIG. 1, although the four level multiplier for multiplying the quadrisignals is shown as the multiplier 7, it can not be prevented that the size thereof will be large as disclosed, for example, in U.S. Pat. No. 4,694,204.

Specifically, the above-described conventional Costas loop carrier recovery circuit has a drawback that it employs many multiplying circuits so that a size thereof will be large.

SUMMARY OF THE INVENTION

Accordingly, the present invention was invented from the above view point. The object of the present invention is to provide a circuit system which realizes a Costas loop carrier recovery circuit suitably formed in the form of large scale integrated circuits, in order to solve the problems involved in the prior art.

To achieve the foregoing object, a Costas loop carrier recovery circuit of the present invention comprises synchronous detection circuit means for performing a synchronous detection with a reference carrier wave for quadriphase modulated waves to detect a common mode component and an orthogonal component thereof and for outputting demodulated signals composed of a common mode component and an orthogonal component; first and second square-law circuits for receiving demodulated signal composed of a common mode component and an orthogonal component to obtain a square-law output; a multiplying circuit for receiving outputs from the first and second square-law circuits to multiply them; a LPF for removing a high frequency component of an output from the multiplying circuit; and a voltage control oscillator in which an output frequency is controlled by an output voltage from the LPF and the reference carrier wave of a common mode component and an orthogonal component is returned to the synchronous detection circuit means.

BRIEF DESCRIPTION OF THE DRAWINGS

For a more complete understanding of the present invention and the advantages thereof, reference is now made to the following description taken in conjunction with the accompanying drawings, in which;

FIG. 3 is a block diagram showing a constitution of a circuit of a quarter square multiplier, wherein

DETAILED DESCRIPTION OF THE PREFERRED EMBODIMENTS

Embodiments of the present invention will be described with reference to the accompanying drawings. The preferred embodiment of the present invention comprises synchronous detection circuit means for performing a synchronous detection with a reference carrier wave for quadriphase modulated waves to detect a common mode component and an orthogonal component thereof and for outputting demodulated signals composed of a common mode component and an orthogonal component; first and second square-law circuits 5 and 6, each receiving demodulated signal (P and Q of FIG. 2) composed of a common mode component and an orthogonal component to obtain a square-law output; a multiplying circuit 7 for receiving outputs from the first and second square-law circuits 5 and 6 to multiply them; a LPF 8 for removing a high frequency component of an output from the multiplying circuit 7; and a VCXO 9 in which an output frequency is controlled by an output voltage from the low pass filter 8 and the reference carrier wave of a common mode component and an orthogonal component is returned to the synchronous detection circuit means.

In the Costas loop carrier recovery circuit according to the embodiment of the present invention, by using the two square-law circuits for squaring the common mode and orthogonal components of the carrier wave and by using the multiplying circuit for multiplying these squared signals, the Costas loop carrier recovery circuit can be simplified, whereby the number of circuits can be greatly reduced and the Costas loop carrier recovery circuit can be easily manufactured in the form of the large scale integrated circuit.

Figure 2:
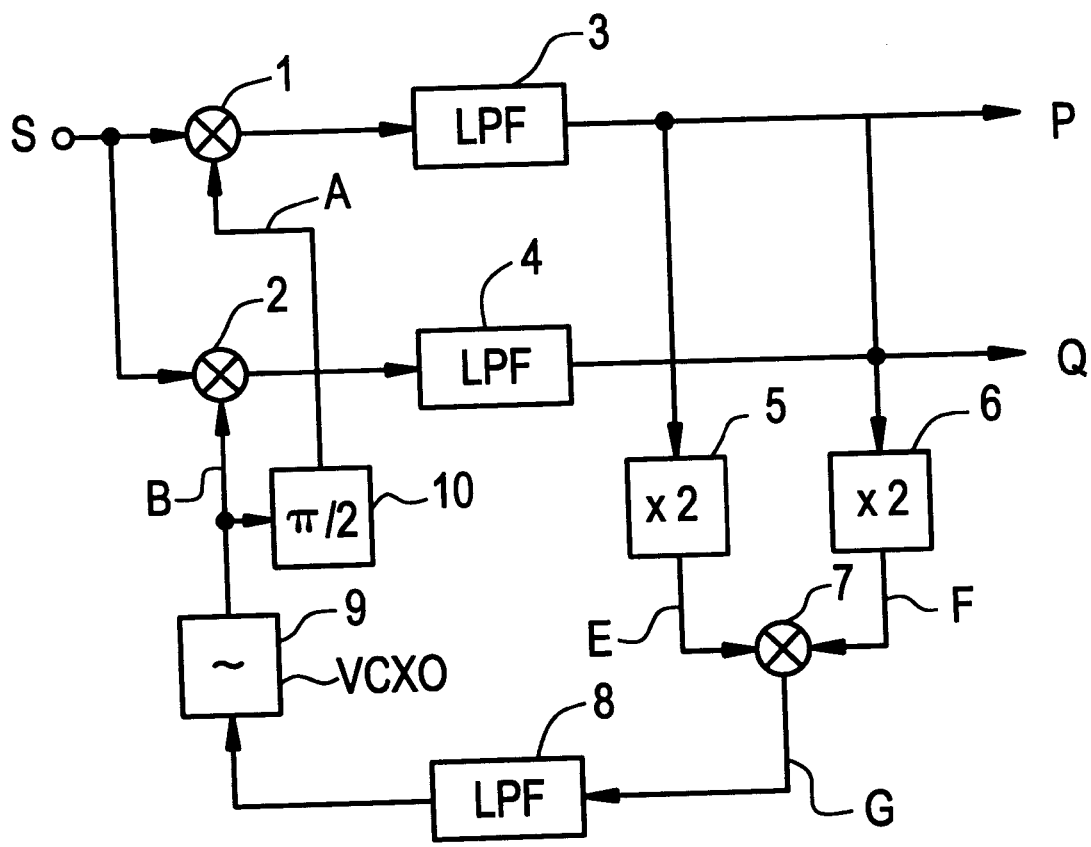
FIG. 2 is a block diagram showing a constitution of an embodiment of a Costas loop carrier recovery circuit of the present invention.

In order to make more detailed descriptions of the present invention, an embodiment of the present invention will be described below. FIG. 2 is a block diagram showing a Costas loop carrier recovery circuit according to an embodiment of the present invention.

Figure 1:
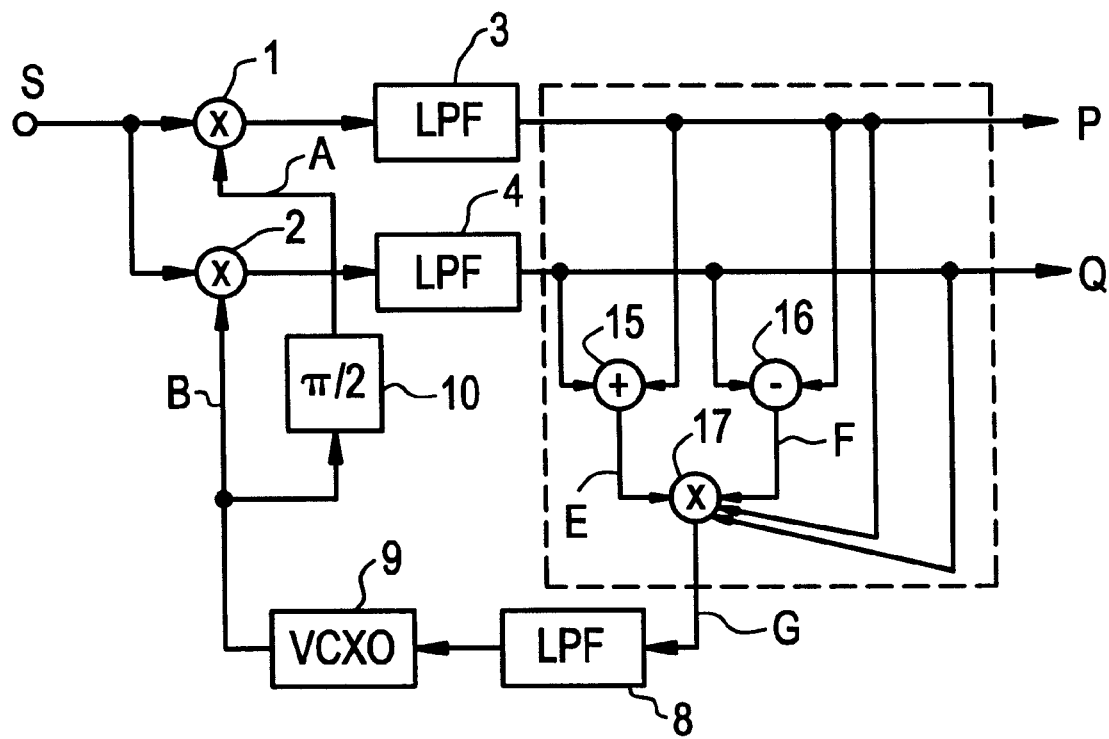
FIG. 1 is a block diagram showing a constitution of a conventional Costas loop carrier recovery circuit.

Referring to FIG. 2, the carrier recovery circuit according to the embodiment is constituted similarly to that of the prior art shown in FIG. 1 such that a phase synchronous circuit constituted by a PLL is controlled by a signal obtained by removing a sign component from an input carrier wave.

In FIG. 2, reference numerals 1, 2 and 7 denote multipliers; 3, 4 and 8, LPFs; 5 and 6, square-law circuits; 9, VCXO; and 10, a phase shifter.

A signal which is a quadriphase modulated wave is expressed by the following equation (11) when $\omega t$ is a frequency of the carrier wave and $\theta$ is subjected to phase variation among 0, $\pi/2$, $\pi$ and $3\pi/2$.

$$S = E \cos(\omega t + \theta) \quad (11)$$

Furthermore, assuming that two outputs from the VCXO 9 are A and B, one being an output obtained by shifting the phase by $\pi/2$, A and B are expressed by the following equations (12) and (13).

$$A = E_1 \sin(\omega t + \theta_1) \quad (12)$$

$$B = E_1 \cos(\omega t + \theta_1) \quad (13)$$

When the quadriphase modulated wave S and the outputs A and B from the VCXO 9 are demodulated by the multiplying circuits 1 and 2 and then they are passed through the LPFs 3 and 4, an output from the multiplying circuit 1 is obtained from the equation (11)×the equation (12) as is expressed by the following equation (14).

$$E\cos(\omega t + \theta) \times E_1 \sin(\omega t + \theta_1) = \frac{E \cdot E_1}{2} \{\sin(2\omega t + \theta - \theta_1) - \sin(\theta - \theta_1)\} \quad (14)$$

When the output from the multiplying circuit 1 is passed through the LPF 3, alternative components are removed and the following equation (15) can be obtained.

$$\frac{E \cdot E_1}{2} \sin(\theta - \theta_1) \quad (15)$$

Similarly, the output from the multiplying circuit 2 is obtained from the equation (11)×the equation (13) as is expressed in the following equation (16).

$$E\cos(\omega t + \theta) \times E_1 \cos(\omega t + \theta_1) = \frac{E \cdot E_1}{2} \{\cos(2\omega t + \theta + \theta_1) + \cos(\theta - \theta_1)\} \quad (16)$$

When the output from the multiplying circuit 2 is passed through the LPF 4, alternative components are removed, and the following equation (17) can be obtained.

$$\frac{E \cdot E_1}{2} \cos(\theta - \theta_1) \quad (17)$$

In the Costas loop carrier recovery circuit, the computation circuit after the LPFs 3 and 4 is a circuit for keeping the phase of the output signal from the VCXO 9 constant whichever phase state $(0, \pi/2, \pi, 3\pi/2)$ the quadriphase modulated wave of the input carrier wave may take.

Assuming that the demodulated signal of the equation (15) is P and the signal of the equation (17) is Q, $P^2$ is output at the output E of the square-law circuit 5; $Q^2$, at the output F of the square-law circuit 6; and $P^2 \times Q^2$, at the output G of the multiplying circuit 7. Furthermore, the output signal at the point E is expressed by the following equation (18).

$$P^2 = \left\{\frac{E \cdot E_1}{2} \sin(\theta - \theta_1)\right\}^2 \quad (18)$$
$$= \frac{(E \cdot E_1)^2}{8} \{1 - \cos 2(\theta - \theta_1)\}$$

The output signal at the point F is expressed by the following equation (19).

$$Q^2 = \left\{\frac{E \cdot E_1}{2} \cos(\theta - \theta_1)\right\}^2 \quad (19)$$
$$= \frac{(E \cdot E_1)^2}{8} \{1 + \cos 2(\theta - \theta_1)\}$$

Therefore, for the point G, the following equation (20) is obtained from the equation (18)×the equation (19).

$$P^2 \times Q^2 = \left\{\frac{E \cdot E_1}{2} \sin(\theta - \theta_1)\right\}^2 \times \left\{\frac{E \cdot E_1}{2} \cos(\theta - \theta_1)\right\}^2 \quad (20)$$
$$= \left\{\frac{(E \cdot E_1)^2}{8}(1 - \cos(2\theta - 2\theta_1))\right\} \times$$
$$\left\{\frac{(E \cdot E_1)^2}{4}(1 + \cos(2\theta - 2\theta_1))\right\}$$
$$= \frac{(E \cdot E_1)^4}{64} [1 - \{\cos 2(\theta - \theta_1)\}^2]$$
$$= \frac{(E \cdot E_1)^4}{128} \{1 - \cos 4(\theta - \theta_1)\}$$

Since the phase error $(\theta - \theta_1)$ between the quadriphase modulated wave and the output signal from the VCXO 9 is $n\pi/2$ (n: integer) and $4(\theta - \theta_1) = 2n\pi$ and $\cos 4(\theta - \theta_1) = 1$, the output voltage is relatively zero. Specifically, the PLL is locked at this state.

Therefore, when this output is returned to the VCXO 9 through the LPF 8, data of the points P and Q will be demodulated.

Moreover, at to the circuit, the square-law circuit has a more simple configuration than the multiplying circuit, whereby substantially ideal square-law characteristics can be obtained over relatively wide input range in the bipolar processes. Also, in the CMOS processes, square-law characteristics which is considered to be ideal can be obtained in a wide input range.

For example, if a quarter-square multiplier obtained by cross-coupling the outputs of the two square-law circuits is adopted, the size of the circuit can be reduced to half or the size of the circuit can be reduced to be less than half when the input circuit is included.

Figure 3A:
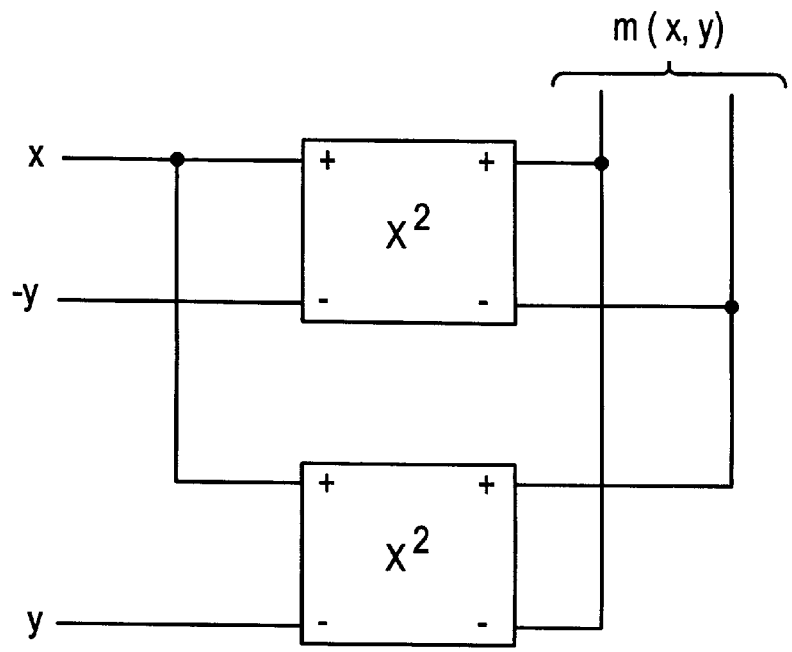
FIG. 3(a) shows a principal constitution of the quarter square multiplier and FIG. 3(b) shows a constitution of a multiplier consisting of two square circuits which are cross-coupled.
Figure 3B:
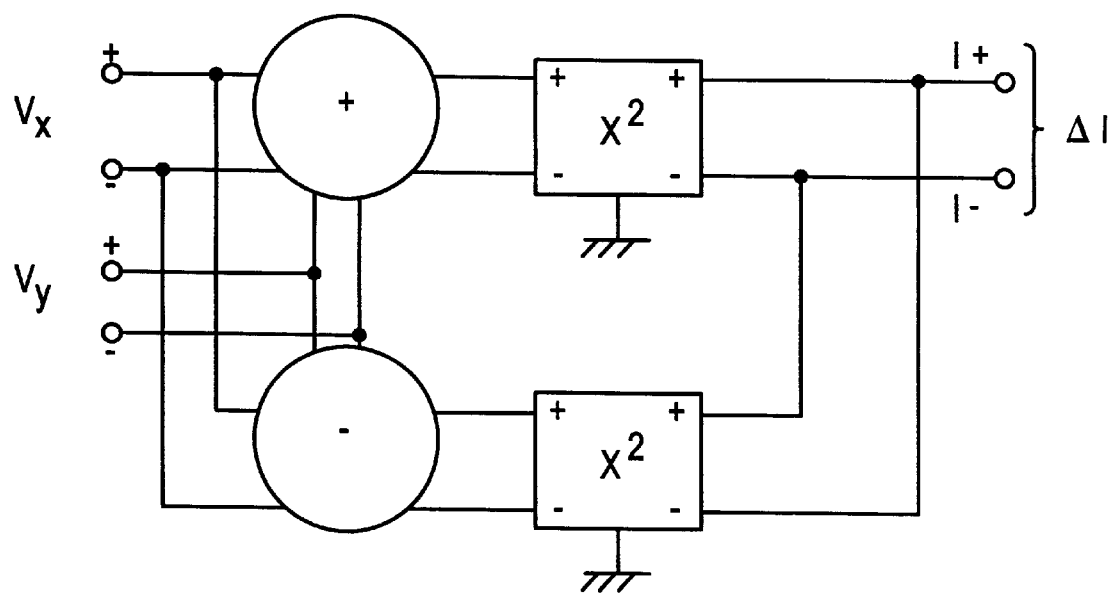

For reference, a block diagram of a principal constitution of the quarter-square multiplier is shown in FIG. 3(*a*) and a block diagram of a constitution of the multiplier consisting of the two square-law circuit which are cross-coupled is shown in FIG. 3(*b*).

As described above, according to the present invention, a circuit constitution of the Costas loop carrier recovery circuit can be simplified and the Costas loop carrier recovery circuit can be easily manufactured in the form of a large scale integrated circuit.

This is because the present invention has an ability to reduce the circuit size and is realized by using the square-law circuit having an excellent characteristic thereby achieving an easiness of manufacturing in the form of a large scale integrated circuit.

What is claimed is:

1. A Costas loop carrier recovery circuit comprising:

a synchronous detection circuit for performing a synchronous detection of an inputted signal using a reference carrier wave for quadriphase modulated waves to detect a common mode component and an orthogonal component thereof and for outputting demodulated signals composed of said common mode component and said orthogonal component;

first and second square-law circuits for receiving said demodulated signals composed of said common mode component and said orthogonal component, respectively, to obtain square-law outputs;

a multiplying circuit for receiving said square-law outputs from said first and second square-law circuits to multiply said square-law outputs to produce a multiplied output;

a low pass filter for removing a high frequency component of said multiplied output; and a voltage control oscillator in which an output frequency is controlled by an output signal from said low pass filter and returning said reference carrier wave to said synchronous detection circuit.

2. A Costas loop carrier recovery circuit according to claim 1, wherein said synchronous detection circuit comprises:

first and second multipliers which perform a synchronous detection using said reference carrier wave to detect said common mode component and said orthogonal component thereof to output said demodulated signals composed of said common mode component and said orthogonal component; and a low pass filter which filters said outputs from the first and second multipliers.

* * * * *

UNITED STATES PATENT AND TRADEMARK OFFICE
CERTIFICATE OF CORRECTION

PATENT NO. : 5,982,200
DATED : November 9, 1999
INVENTOR(S) : Katsuji KIMURA

It is certified that error appears in the above-identified patent and that said Letters Patent is hereby corrected as shown below:

Column 2, line 10, delete "$E \cos(\omega t + \theta) \times E_1 \sin(\omega t + \theta_1)$".

Signed and Sealed this

Seventh Day of November, 2000

Attest:

Q. TODD DICKINSON

*Attesting Officer*     *Director of Patents and Trademarks*